(12) United States Patent
Watanabe et al.

(10) Patent No.: US 7,078,628 B2
(45) Date of Patent: Jul. 18, 2006

(54) SUBSTRATE FOR CIRCUIT WIRING

(75) Inventors: Hiromichi Watanabe, Kobe (JP);
Yoshifumi Fukatsu, Kobe (JP);
Hideaki Kaino, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 250 days.

(21) Appl. No.: 10/723,349

(22) Filed: Nov. 25, 2003

(65) Prior Publication Data
US 2004/0182601 A1    Sep. 23, 2004

(30) Foreign Application Priority Data
Nov. 26, 2002   (JP)   ............... 2002-342556

(51) Int. Cl.
*H05K 1/03* (2006.01)
(52) U.S. Cl. ..................................... 174/256
(58) Field of Classification Search ................ 174/259, 174/260, 256
See application file for complete search history.

(56) References Cited
U.S. PATENT DOCUMENTS
6,201,696 B1 * 3/2001 Shimizu et al. ............. 361/704
6,307,749 B1 * 10/2001 Daanen et al. .............. 361/704
6,779,260 B1 * 8/2004 Brandenburg et al. ........ 29/841
2004/0084756 A1 * 5/2004 Kawakami et al.

FOREIGN PATENT DOCUMENTS
JP         5-129474        5/1993
JP         11008450        1/1999

* cited by examiner

*Primary Examiner*—Randy W. Gibson
*Assistant Examiner*—Yuriy Semenenko
(74) *Attorney, Agent, or Firm*—Christie, Parker & Hale, LLP

(57) ABSTRACT

The present invention concerns a substrate for circuit wiring in which an electronic component is mounted, by soldering, to a wiring pattern formed on an insulated layer deposited over a metallic substrate. A silica-based filler and a rubber-based filler are added in the insulated layer to reduce the linear thermal expansion of the layer and increase its elastic modulus. The mounting portion of an electronic component is molded with a resin material to which a silica-based filler has been added, and which thus has a coefficient of linear thermal expansion smaller than the coefficient of linear thermal expansion of the insulated layer. This serves to alleviate the stress caused by the linear thermal expansion of the metallic substrate, and thereby to prevent separation from occurring between the insulated layer and the metallic substrate, as well as between the insulated layer and the wiring pattern, when subjected to a high-temperature environment.

14 Claims, 2 Drawing Sheets

SUBSTRATE FOR CIRCUIT WIRING

CROSS-REFERENCE TO RELATED APPLICATION

This application claims priority of Japanese Patent Application Number 2002-342556, filed on Nov. 26, 2002.

BACKGROUND OF THE INVENTION

1. Field of the Invention

The present invention relates to a substrate for circuit wiring on which electronic components and the like are mounted and, more particularly, to a substrate for circuit wiring which is particularly suited for use in an electronic apparatus used in a high-temperature environment (105° C. to 140° C.), and in which provisions are made to prevent the linear thermal expansion of the metallic substrate itself, due to the high temperature, from affecting the mounting condition of the electronic components, etc.

2. Description of the Related Art

For an electronic apparatus incorporating electronic components, in particular, an automotive electronic apparatus mounted in a restricted space subjected to a high-temperature environment, such as an electronic control unit for controlling an automotive engine, etc., there is a need to reduce the size of the apparatus and the space for mounting and, at the same time, increase heat dissipation to enable the electronic apparatus to be mounted in an engine compartment.

As the environment inside the engine compartment is severe because of high temperatures, large variations in temperature, etc., a base substrate made of a ceramic material having high heat resistance has been used for a substrate for circuit wiring on which electronic components are mounted, and a heat sinking construction such as a finned heat sink has been required for heat dissipation. As a result, the electronic apparatus was bulky and, hence, the amount of reduction in size and space is limited. In view of this situation, there has developed a need for a substrate that can achieve reductions in size, space and cost while, at the same time, achieving improvements in heat dissipation performance, and metal-based circuit wiring substrates having excellent heat dissipation characteristics are used to meet such demands.

Traditionally, it has been common to use a highly heat resistant ceramic substrate as the substrate for electronic circuits used in an electronic control unit or the like mounted in a high-temperature environment such as inside an automobile engine compartment. On the other hand, the major reasons that metallic substrates made of aluminum alloy, etc. have come to be used are that the cost of the metallic substrate is lower than that of the ceramic substrate, that the ceramic substrate is brittle and thus intractable, that the ceramic substrate requires the provision of a heat sinking construction, that the metallic substrate can be fabricated in the same process as a conventional resin substrate, and that design changes can be easily implemented in the case of the metallic substrate. For these reasons, the metallic substrate has been used, in particular, for output drive circuitry that does not need high-density packaging.

For reasons of heat dissipation and economy, an aluminum plate is often used for the metal-based circuit wiring substrate; however, when the circuit wiring substrate assembled into an electronic apparatus is repeatedly subjected to heating and cooling, in actual use conditions, a large thermal stress is caused due to the difference in coefficient of thermal expansion between the aluminum plate as the substrate and the electronic components, especially, chip components, mounted thereon. This results in the problem that electrical reliability degrades because, due to the thermal stress, cracks are caused at or near the soldered portions at which the components are fixed.

Furthermore, the metal-based circuit wiring substrate requires the provision of an insulated film on the substrate surface for mounting of the electronic components, as the substrate is constructed from a metallic plate. When a material having low elastic modulus is used for the insulated layer, the stress occurring between the metallic plate and the electronic components can be alleviated. However, as the chip component size increases, the elastic modulus of the material needs to be further reduced significantly, but generally, a low elastic modulus material has poor adhesion to the aluminum and the copper forming the circuit conductors.

The resulting problem is that it is difficult to obtain a metal-based circuit wiring substrate that can achieve excellent adhesion between the circuit wiring substrate and conductive foils such as wiring patterns. In particular, since the adhesion of the conductive foils to the circuit wiring substrate markedly drops under high-temperature conditions, it becomes increasingly difficult to obtain a metal-based circuit wiring substrate having high-temperature resistance that can withstand the use at a temperature exceeding 105° C.

In view of this, there is proposed, for example, in Japanese Unexamined Patent Publication No. 11-8450, a metal-based circuit wiring substrate having excellent heat dissipation characteristics by improving the adhesion between the metallic substrate and the conductive foil pattern, thereby increasing the ability to alleviate the stress so that defects such as cracks will not be caused at or near the soldered portions of electronic components when the metal-based circuit wiring substrate is subjected to rapid heating or cooling.

In the above proposed metal-based circuit wiring substrate, to address the problem of separation in a high-temperature environment, the thermal stress transmitted from the metallic substrate to the electronic components is reduced by reducing the elastic modulus of the insulated layer formed on the metallic substrate. The insulated layer here is formed by adding a rubber-based filler and a silica-based filler to an epoxy resin, thereby lowering elastic modulus while improving the heat dissipation characteristics.

This structure alleviates the stress occurring due to the difference in linear thermal expansion between the metallic substrate and the electronic components mounted thereon, and thus serves to prevent cracks from being caused to the soldered portions of the electronic components. In the prior art, as a silica-based filler was added to the insulated layer to increase heat dissipation, the insulated layer had high elastic modulus.

The prior art metal-based circuit wiring substrate achieves high heat dissipation and low elastic modulus by adding a silica-based filler and a rubber-based filler to the insulated layer; with this structure, the stress occurring due to the difference in linear thermal expansion between the metallic substrate and the electronic components mounted thereon can be alleviated, and thus, cracks can be prevented from being caused in the soldered portions of the electronic components.

At high temperatures, the metallic substrate, the insulated layer, and the electronic components exhibit differing degrees of linear thermal expansion. Accordingly, for the linear thermal expansion of the insulated layer, the proportions of the rubber-based filler and the silica-based filler are adjusted; that is, to alleviate the stress caused by the linear thermal expansion, the linear thermal expansion of the insulated layer is made larger than the linear thermal expansion of the electronic components but held smaller than the linear thermal expansion of the metallic substrate.

However, if the coefficient of linear thermal expansion of the insulated layer is properly adjusted by lowering the elastic modulus of the insulated layer on the metal-based circuit wiring substrate, as the electronic components, the insulated layer, and the metallic substrate respectively have differing coefficients of linear thermal expansion, there arises the problem that the adhesion between the insulated layer and the copper foil wiring pattern as well as the adhesion between the insulated layer and the metallic substrate becomes weak in a high-temperature environment where the structure is repeatedly subjected to high and low temperatures and, in the case of a low elastic modulus material, the possibility of the aluminum plate and the circuit conductors of copper becoming separated from the insulated layer increases because adhesion of the low elastic modulus material to the aluminum and the copper is poor.

It is accordingly an object of the present invention to provide a substrate for circuit wiring which is particularly suited for use in an electronic apparatus used in a high-temperature environment exceeding 105° C., and in which the linear thermal expansion of the metallic substrate itself is prevented from affecting the mounting condition of electronic components, etc.; this is achieved by molding the metal-based circuit wiring substrate with a resin material whose coefficient of linear thermal expansion has been adjusted.

SUMMARY OF THE INVENTION

To solve the above problem, the present invention provides a substrate for circuit wiring in which an electronic component is mounted, by soldering to a wiring pattern formed on an insulated layer deposited over a metallic substrate, characterized in that mounting portion of the electronic component is resin-sealed with a resin material having a coefficient of linear thermal expansion smaller than the coefficient of linear thermal expansion of the insulated layer, in that the insulated layer is formed from a resin material containing an inorganic filler for increasing heat dissipation and an elastic filler for reducing elastic modulus, and in that the linear thermal expansion and the elasticity of the molding resin material are adjusted by adding an inorganic filler thereto.

The inorganic filler has electrical insulation properties and high thermal conductivity, and comprises one or more materials selected from the group consisting of silicon oxide, aluminum oxide, aluminum nitride, silicon nitride, and boron nitride, and the metallic substrate is aluminum based.

In the substrate for circuit wiring described above, the mounting portion of the electronic component is molded with the resin material in integral fashion with the insulated layer and the metallic substrate.

BRIEF DESCRIPTION OF THE DRAWINGS

The above object and features of the present invention will become more apparent from the following description of the embodiment of the present invention given with reference to the accompanying drawings, wherein.

DESCRIPTION OF THE EMBODIMENT OF THE INVENTION

Figure 3:
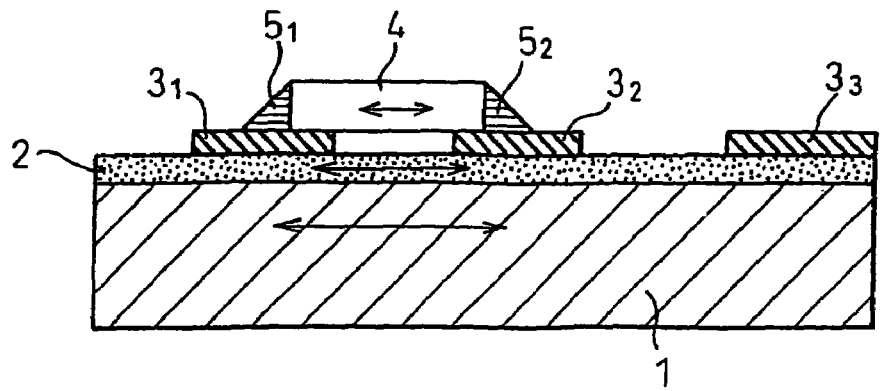
FIG. 3 is a cross-sectional view of a substrate for circuit wiring on which an electronic component is mounted according to the prior art.

Before describing the embodiment of the present invention, the related art pertinent to the present invention and the disadvantage associated with the related art will be described with reference to the related drawings. FIG. 3 shows a cross-sectional view of a substrate for circuit wiring, illustrating how an electronic component is mounted on the metal-based circuit wiring substrate according to the related art.

In the figure, reference numeral 1 indicates the metal-based circuit wiring substrate made of an aluminum alloy or like material, whose thickness is 2 mm. Reference numeral 2 is an insulated layer made of an epoxy resin material; the insulated layer 2 is deposited in the form of a film to a thickness of 90 μm over the entire surface of the circuit wiring substrate 1. Wiring patterns $3_1$ to $3_3$ made of conductive foils of copper or like material are formed on the insulated layer 2, and an electronic component 4 such as a chip is mounted on two of the wiring patterns $3_1$ to $3_3$ in such a manner as to straddle the gap therebetween. In the example of FIG. 3, one end of the electronic component 4 is attached to the wiring pattern $3_1$ by solder $5_1$, and the other end to the wiring pattern $3_2$ by solder $5_2$, the electronic component 4 and the wiring patterns $3_1$ to $3_3$ thus forming an electronic circuit.

In the prior art, it is known to provide a metal-based substrate for circuit wiring in which an insulated film made of an epoxy resin or the like containing an inorganic filler is formed on a metallic substrate and wiring patterns made of conductive foils are arranged thereon; this type of circuit wiring substrate achieves high heat dissipation due to the inorganic filler added to the epoxy resin or the like, and is used as a substrate for mounting thereon electronic components that generate much heat in operation.

However, in the prior art metal-based circuit wiring substrate shown in FIG. 3, if the insulated layer 2 is formed from an epoxy resin containing an inorganic filler in order to increase heat dissipation, the coefficient of thermal expansion of the epoxy resin itself is reduced due to the addition of the inorganic filler and the epoxy resin becomes stiff, and as a result, the coefficient of thermal expansion of the insulated layer 2 becomes smaller than that of the metallic substrate 1 that has a relatively large coefficient of thermal expansion. Accordingly, when the metal-based circuit wiring substrate is subjected to a high-temperature environment, separation may occur between the metallic substrate 1 and the insulated layer 2 in the high-temperature environment because of the difference, in coefficient of thermal expansion, between the metallic substrate 1 and the insulated layer 2.

In the previously proposed metal-based circuit wiring substrate, the elastic modulus of the insulated layer 2 formed on the metallic substrate 1 is lowered as a means to solve the problem of separation in a high-temperature environment.

Figure 4:
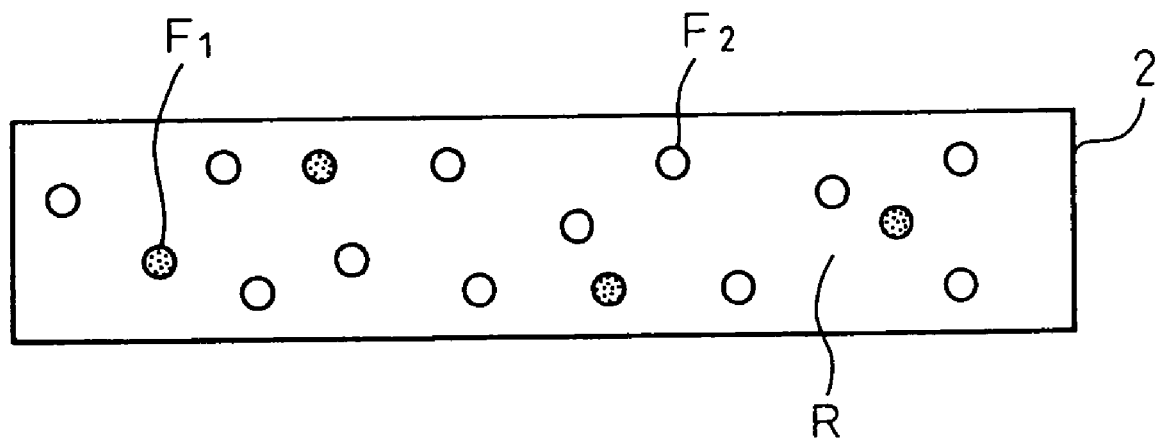
FIG. 4 is an enlarged cross-sectional view of an insulated layer in the substrate for circuit wiring shown in FIG. 3.

Lowering the elastic modulus serves to alleviate the thermal stress transmitted from the metallic substrate 1 to the electronic component. FIG. 4 is an enlarged cross-sectional view showing the structure of the thus adjusted insulated layer 2.

The insulated layer 2 is formed using an epoxy resin R as the base material and, as shown in the figure, a rubber-based filler $F_1$ and a silica-based filler $F_2$ are added to it. The rubber-based filler $F_1$ confers elasticity to the insulated layer 2, while the addition of the silica-based filler $F_2$ serves to increase the heat dissipation. The rubber-based filler $F_1$ may be added by dispersing rubber, such as butadiene-based rubber, acrylic rubber, or silicon rubber, through a conventional epoxy resin, but as an alternative method of conferring elasticity, urethane modification may be applied, or a flexible epoxy resin, such as a dimer acid glycidyl ester, polyglycol type epoxy resin or a butyl ether modified bisphenol-A epoxy resin, may be used, or a flexible curing agent such as a modified polyamine-based agent may be used for a conventional epoxy resin, or a combination of these may be used.

Examples of materials, other than the silica-based filler, that confer high heat dissipation, and that have good electrical insulation and high thermal conductivity, include aluminum oxide, aluminum nitride, silicon nitride, and boron nitride, and these materials may be used singly or in a suitable combination thereof.

As described above, the insulated layer 2 is formed by adding the rubber-based filler $F_1$ and the silica-based filler $F_2$ to the epoxy resin R to achieve a low elastic modulus as well as high heat dissipation.

This structure alleviates the stress occurring due to the difference in linear thermal expansion between the metallic substrate 1 and the electronic component 4 mounted thereon, and thus serves to prevent cracks from being caused to the soldered portion $5_1$ or $5_2$ of the electronic component 4. In the prior art, as a silica-based filler was added to the insulated layer to increase heat dissipation, the insulated layer had a high elastic modulus.

The above-described prior art metal-based circuit wiring substrate achieves high heat dissipation and a low elastic modulus by adding a silica-based filler and a rubber-based filler in the insulated layer. With this structure, the stress occurring due to the difference in linear thermal expansion between the metallic substrate and the electronic component mounted thereon can be alleviated, and thus, cracks can be prevented from being caused at the soldered portion of the electronic component.

In FIG. 3, the linear thermal expansions that the metallic substrate 1, the insulated layer 2, and the electronic component 4 respectively exhibit at high temperatures are shown by respective arrows. The linear thermal expansion of the insulated layer 2 can be adjusted by adjusting the proportions of the rubber-based filler $F_1$ and the silica-based filler $F_2$; that is, to alleviate the stress caused by the linear thermal expansion, the linear thermal expansion of the insulated layer 2 is made larger than the linear thermal expansion of the electronic component 4 but held smaller than the linear thermal expansion of the metallic substrate 1.

However, if the coefficient of linear thermal expansion of the insulated layer is properly adjusted by lowering the elastic modulus of the insulated layer on the metal-based circuit wiring substrate, as the electronic component, the insulated layer, and the metallic substrate have respectively differing coefficients of linear thermal expansion, the adhesion between the insulated layer and the copper foil wiring pattern as well as the adhesion between the insulated layer and the metallic substrate becomes weak in a high-temperature environment where the structure is repeatedly subjected to high and low temperatures and, in the case of a low elastic modulus material, the aluminum plate and the circuit conductors of copper may become separated from the insulated layer because adhesion of the elastic modulus material to the aluminum and the copper is poor.

Accordingly, in the embodiment of the present invention, the metal-based circuit wiring substrate with electronic components mounted thereon is molded with a resin material whose coefficient of linear thermal expansion has been adjusted, thus making provisions to prevent the linear thermal expansion of the metallic substrate itself from affecting the mounting condition of the electronic components, etc. when the circuit wiring substrate is incorporated in an electronic apparatus used at a temperature exceeding 105° C.

Figure 1:
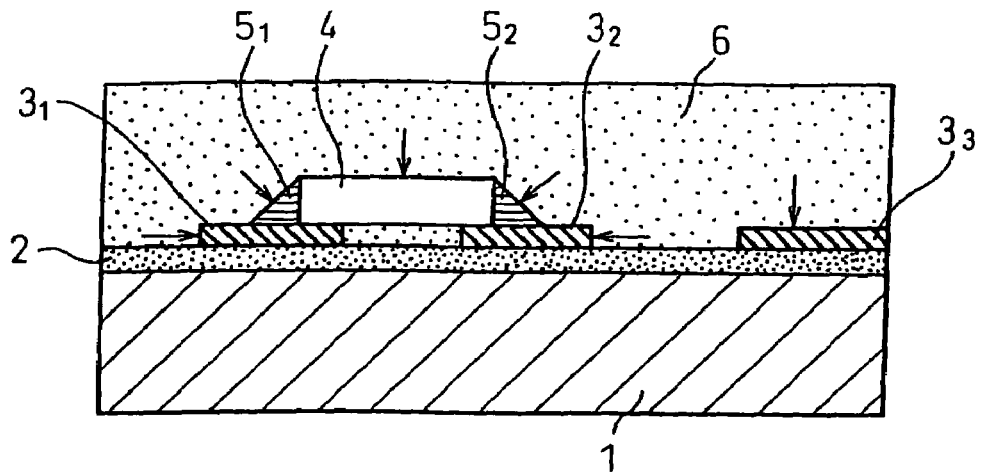
FIG. 1 is a cross-sectional view of a substrate for circuit wiring which is resin-molded according to the embodiment.

The embodiment of the substrate for circuit wiring according to the present invention will be described below with reference to FIGS. 1 and 2. FIG. 1 shows a cross-sectional view of the substrate for circuit wiring according to the present embodiment. The circuit wiring substrate shown in FIG. 1 is based on the structure of the metal-based circuit wiring substrate shown in FIG. 3. Therefore, in the structure shown in FIG. 1, the same parts as those in FIG. 3 are designated by the same reference numerals.

In the circuit wiring substrate shown in FIG. 1, as in the circuit wiring substrate shown in FIG. 3, the metallic substrate 1 made of an aluminum alloy or like material is used as the base, and the insulated layer 2 is formed on the metallic substrate 1. Wiring patterns $3_1$ to $3_3$ made of conductive foils of copper or like material are formed on the insulated layer 2, and the electronic component 4 such as a chip is electrically connected to the wiring patterns $3_1$ and $3_2$ by being mounted in such a manner as to straddle the gap therebetween. Electrical connections between the electronic component 4 and the respective wiring patterns $3_1$ and $3_2$ are made by soldering at portions $5_1$ and $5_2$.

The insulated layer 2 formed on the metallic substrate 1 has the function of making the effect of the linear thermal expansion of the metallic substrate 1 difficult to transmit to the electronic component 4, and serves to alleviate the stress that occurs when the circuit wiring substrate is subjected to a high-temperature environment; as shown in FIG. 4, the rubber-based filler $F_1$ as an elastic filler and the silica-based filler $F_2$ as an inorganic filler for increasing high heat dissipation are added in the insulated layer 2.

The structure of the circuit wiring substrate described up to this point is the same as that of the circuit wiring substrate shown in FIG. 3; in this condition, as the electronic component 4, the insulated layer 2, and the metallic substrate 1 have respectively differing coefficients of linear thermal expansion, when the circuit wiring substrate is subjected to a high-temperature environment, separation may occur between the insulated layer and the copper foil wiring pattern or the solder and also between the insulated layer and the metallic substrate.

Accordingly, in the circuit wiring substrate of the present embodiment, the mounting portion of the electronic component 4 in the above-described structure is resin-molded with a resin containing an inorganic filler. By adding an inorganic filler to the resin, the coefficient of linear thermal expansion of the resin is suitably adjusted, to achieve low linear thermal expansion and high elastic modulus. The resin-molded circuit wiring substrate is shown in FIG. 1; as shown, the molding resin 6 formed over the insulated layer 2 molds therein the wiring patterns $3_1$ to $3_3$ and the solder portions $5_1$ and $5_2$ as well as the electronic component 4.

Figure 2:
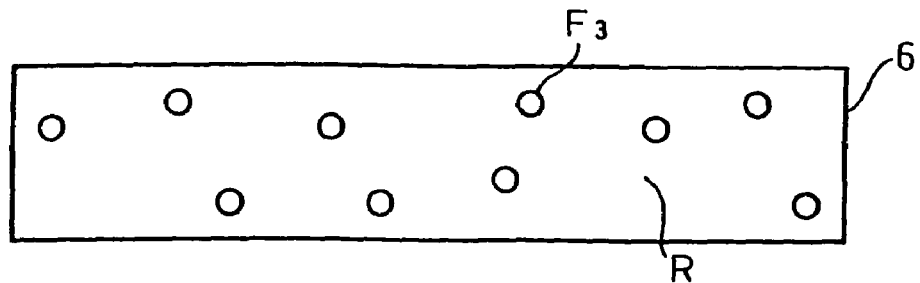
FIG. 2 is an enlarged cross-sectional view of a molding resin in the substrate for circuit wiring resin-molded according to the embodiment.

FIG. 2 is an enlarged cross-sectional view schematically illustrating the interior structure of the molding resin 6. The base material of the molding resin 6 is, for example, an epoxy-based resin R, and an inorganic filler, for example, a silica-based filler $F_3$, is added to the resin R. The coefficient of linear thermal expansion of the molding resin 6 is adjusted by adjusting the amount of the silica-based filler $F_3$ added. The coefficient of linear thermal expansion of the resin is usually larger than the coefficient of linear thermal expansion of a metal, but can be made smaller by adding an inorganic filler.

The coefficient of linear thermal expansion of the molding resin 6 is adjusted so that it becomes smaller than the coefficient of linear thermal expansion of the insulated layer 2 but larger than the coefficient of linear thermal expansion of the electronic component 4. When the circuit wiring substrate with the electronic component 4 mounted thereon is resin-molded with the resin whose coefficient of linear thermal expansion has been adjusted as described, the electronic component 4, the solder portions $5_1$ and $5_2$, the wiring patterns $3_1$ to $3_3$, and the insulated layer 2, respectively, can be mechanically held fixed in position. Where they are held fixed is shown by arrows in FIG. 1.

An aluminum plate with a thickness of 2 mm, for example, is used as the metallic substrate 1 whose coefficient of linear thermal expansion is 23 PPM per degree Centigrade, and an epoxy resin with a silica-based filler and a rubber-based filler added to it is deposited to a thickness of 90 μm to form the insulated layer 2, whose coefficient of linear thermal expansion is thus adjusted to 16 to 20 ppm. When the electronic component 4 soldered to the wiring patterns formed from 70-μm thick copper foils is an IC chip, the coefficient of linear thermal expansion of the electronic component 4 is similar to that of a ceramic substrate, that is, 4 to 7 ppm.

Then, a silica-based filler is added to the epoxy resin used to form the molding resin 6, to make the coefficient of linear thermal expansion of the molding resin smaller than the coefficient of linear thermal expansion of the insulated layer 2 and increase its elastic modulus. As the coefficient of linear thermal expansion of the molding resin 6 is made smaller than the coefficient of linear thermal expansion of the insulated layer 2, even if the metallic substrate 1 exhibits a large linear thermal expansion when the resin-molded circuit wiring substrate is subjected to a high-temperature environment, the stress that the insulated layer 2 exerts on the electronic component 4 and the wiring patterns $3_1$ to $3_3$ is alleviated; furthermore, the sealing resin 6 does not expand when subjected to a high-temperature environment, and undergoes only a small amount of shrinkage when subjected to an external force, and thus the electronic component 4, the solder portions $5_1$ and $5_2$, the wiring patterns $3_1$ to $3_3$, and the insulated layer 2 are mechanically held in position in an integral fashion.

Accordingly, even when the circuit wiring substrate having the above structure is incorporated into an electronic control unit mounted in a high-temperature environment such as inside an automobile engine compartment, separation does not occur between the insulated layer and the copper foil wiring patterns or soldered portions or between the insulated layer and the metallic substrate.

The circuit wiring substrate of the present embodiment has been described for the case where a silica-based filler is used as the inorganic filler to be added to the molding resin, but as in the case of the inorganic filler to be added in the insulated layer, use can be made of other materials such as aluminum oxide, aluminum nitride, silicon nitride, and boron nitride, and these materials may be used singly or in a suitable combination thereof. Any suitable material having good electrical insulation and high thermal conductivity can be used.

The circuit wiring substrate of the present embodiment has been described by taking an epoxy resin as an example of the molding resin but, in carrying out the present embodiment, the sealing resin need not be limited to the epoxy resin, but various other molding resins may be used. If a high thermal conductivity material is added to the resin, the resin molding not only serves to mechanically fix the mounted electronic component, but also serves to enhance heat dissipation performance; by appropriately selecting the material of the filler, effects such as increased moisture resistance and protection against external forces can be achieved.

FIG. 1 shows only a representative portion of the circuit wiring substrate of the present embodiment, but actually, various electronic components are mounted on the metallic substrate. When resin-molding the structure with a resin containing an inorganic filler, at least the mounting portions of these electronic components must be molded with the resin, and the entire structure comprising the electronic components and the metallic substrate can also be molded with the resin in integral fashion.

The above embodiment has been described primarily for the case where the present invention is applied to a control circuit device such as an electronic control unit mounted in an automobile or the like, but the present invention is not limited in application to the illustrated example, but is equally applicable to other circuit connection devices such as a control circuit connection device for a labor saving apparatus and a control circuit connection device for a communication apparatus; in such cases also, the same effect as achieved in the above embodiment can be obtained.

As described above, in the circuit wiring substrate according to the present invention, as the structure is molded with a resin whose coefficient of linear thermal expansion has been adjusted by adding an inorganic filler, the electronic components, soldered portions, and wiring patterns are held fixed in position on the metallic substrate by the molding resin; in particular, even when the circuit wiring substrate is subjected to a high-temperature environment, separation can be prevented from occurring between the insulated layer and the metallic substrate as well as between the insulated layer and the soldered portions or the wiring patterns.

Accordingly, unlike the prior art, there is no need to use a ceramic substrate having high heat resistance that can withstand use in a high-temperature environment, and the invention allows the use of a metal and, in particular, an inexpensive and easy-to-manufacture aluminum alloy, as the base material of the circuit wiring substrate.

Furthermore, as an inorganic filler is added to the resin used to seal the circuit wiring substrate, the molding resin has a heat dissipation capability because of the high thermal conductivity of the inorganic filler, and this further facilitates heat dissipation from the mounted electronic components.

What is claimed is:

1. A substrate for circuit wiring, comprising:
  a metallic substrate;
  an insulated layer deposited over said metallic substrate;
  at least one electronic component mounted by soldering to a wiring pattern formed on said insulated layer; and
  a resin for molding a mounting portion of said electronic component,
  wherein said resin has a coefficient of linear thermal expansion smaller than the coefficient of linear thermal expansion of said insulated layer.

2. The substrate for circuit wiring as claimed in claim 1, wherein said insulated layer is formed from a resin material containing an inorganic filler for increasing heat dissipation and an elastic filler for reducing an elastic modulus.

3. The substrate for circuit wiring as claimed in claim 1, wherein said insulated layer comprises an inorganic filler having electrical insulation properties and high thermal conductivity.

4. The substrate for circuit wiring as claimed in claim 1, wherein the mounting portion of said electronic component is all-enclosed and molded by said resin with said insulated layer and said metallic substrate in integral fashion.

5. The substrate for circuit wiring as claimed in claim 1, wherein said insulated layer exerts a stress on said electronic component when subjected to a high-temperature environment, and wherein said resin molded to the mounting portion of said electronic component alleviates said stress on said electronic component.

6. The substrate for circuit wiring as claimed in claim 1, wherein said resin molded to the mounting portion of said electronic component does not expand when subjected to a high-temperature environment, and wherein said resin molded to the mounting portion of said electronic component undergoes a shrinkage when subjected to an external force.

7. The substrate for circuit wiring as claimed in claim 1, wherein said electronic component is between said insulated layer and said resin molded to the mounting portion of said electronic component, and wherein said insulated layer is between said electronic component and said metallic substrate.

8. The substrate for circuit wiring as claimed in claim 2, wherein said inorganic filler has electrical insulation properties and high thermal conductivity.

9. A substrate for circuit wiring as claimed in claim 8, wherein said inorganic filler comprises one or more materials selected from the group consisting of silicon oxide, aluminum oxide, aluminum nitride, silicon nitride, and boron nitride.

10. A substrate for circuit wiring as claimed in claim 9, wherein said metallic substrate is aluminum based.

11. A substrate for circuit wiring as claimed in claim 2, wherein the mounting portion of said electronic component is all-enclosed and molded by said resin with said insulated layer and said metallic substrate in integral fashion.

12. The substrate for circuit wiring as claimed in claim 11, wherein said inorganic filler has electrical insulation properties and high thermal conductivity.

13. The substrate for circuit wiring as claimed in claim 12, wherein said inorganic filler comprises one or more materials selected from the group consisting of silicon oxide, aluminum oxide, aluminum nitride, silicon nitride, and boron nitride.

14. The substrate for circuit wiring as claimed in claim 13, wherein said metallic substrate is aluminum based.

* * * * *

UNITED STATES PATENT AND TRADEMARK OFFICE
CERTIFICATE OF CORRECTION

PATENT NO. : 7,078,628 B2  Page 1 of 1
APPLICATION NO. : 10/723349
DATED : July 18, 2006
INVENTOR(S) : Watanabe et al.

It is certified that error appears in the above-identified patent and that said Letters Patent is hereby corrected as shown below:

In the Claims

Column 10, line 6, Claim 9      Delete "A",
                                 Insert --The--

Column 10, line 11, Claim 10    Delete "A",
                                 Insert --The--

Column 10, line 13, Claim 11    Delete "A",
                                 Insert --The--

Signed and Sealed this

Twenty-seventh Day of March, 2007

JON W. DUDAS
*Director of the United States Patent and Trademark Office*